US011595066B2

(12) United States Patent
Kularatna et al.

(10) Patent No.: US 11,595,066 B2
(45) Date of Patent: Feb. 28, 2023

(54) INTERFERENCE MITIGATION WITH MULTI-BAND DIGITAL PRE-DISTORTION

(71) Applicant: Nokia Technologies Oy, Espoo (FI)

(72) Inventors: Shavantha Kularatna, Flower Mound, TX (US); Tian He, Plano, TX (US); Christian Reichl, Ulm (DE); Aki Korhonen, Oulu (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 17/471,893

(22) Filed: Sep. 10, 2021

(65) Prior Publication Data
US 2022/0085838 A1    Mar. 17, 2022

(30) Foreign Application Priority Data
Sep. 15, 2020  (FI) ...................................... 20205889

(51) Int. Cl.
*H04B 1/04* (2006.01)

(52) U.S. Cl.
CPC ... *H04B 1/0475* (2013.01); *H04B 2001/0425* (2013.01)

(58) Field of Classification Search
CPC H04B 1/0475; H04B 1/04; H04B 2001/0425; H04B 2001/0408; H04B 7/0417
USPC .................................................. 375/295–297
See application file for complete search history.

(56) References Cited

U.S. PATENT DOCUMENTS

| | | | |
|---|---|---|---|
| 8,842,033 B1* | 9/2014 | Abramzon | H03M 1/1052 375/296 |
| 9,787,336 B1* | 10/2017 | Cova | H04B 1/0475 |
| 10,171,041 B2* | 1/2019 | Dzhigan | H04B 1/0475 |
| 2011/0064171 A1 | 3/2011 | Huang et al. | |
| 2013/0251065 A1 | 9/2013 | Bai | |
| 2016/0065249 A1 | 3/2016 | Yang et al. | |
| 2016/0079933 A1 | 3/2016 | Fehri et al. | |
| 2016/0119004 A1 | 4/2016 | Rollins | |

(Continued)

FOREIGN PATENT DOCUMENTS

| | | |
|---|---|---|
| CN | 103618684 A | 3/2014 |
| CN | 106685868 A | 5/2017 |

(Continued)

OTHER PUBLICATIONS

Gilabert et al., "The Digital Predistorter Goes Multi-dimensional: DPD for Concurrent Multi-band Envelope Tracking and Outphasing Power Amplifiers", IEEE Microwave Magazine, vol. 20, No. 5, May 2019, 11 pages.

(Continued)

*Primary Examiner* — Emmanuel Bayard
(74) *Attorney, Agent, or Firm* — Squire Patton Boggs (US) LLP

(57) ABSTRACT

A method comprising determining a plurality of digital pre-distortion engines, determining signals for the pre-distortion engines, determining terms for a matrix and filter the matrix, based on the filtered matrix, determining correlation matrixes, obtaining pre-distorted signals from the digital pre-distortion engines, wherein the pre-distorted signals are pre-distorted based on the determined correlation matrixes, and combining the pre-distorted signals to a combined pre-distorted signal.

19 Claims, 7 Drawing Sheets

(56) References Cited

U.S. PATENT DOCUMENTS

| | | | |
|---|---|---|---|
| 2017/0244582 A1* | 8/2017 | Gal | H04L 25/03885 |
| 2017/0338841 A1* | 11/2017 | Pratt | H04B 1/0475 |
| 2018/0375480 A1* | 12/2018 | Rollins | H03F 1/3252 |
| 2019/0097866 A1* | 3/2019 | Sestok, IV | H04L 27/3863 |
| 2020/0021253 A1 | 1/2020 | Ghannouchi et al. | |
| 2020/0186103 A1 | 6/2020 | Weber et al. | |
| 2021/0144046 A1* | 5/2021 | Fuller | H03F 1/3258 |
| 2022/0052653 A1* | 2/2022 | Pratt | H03F 3/19 |

FOREIGN PATENT DOCUMENTS

| | | |
|---|---|---|
| WO | 2016/138880 A1 | 9/2016 |
| WO | 2018/156932 A1 | 8/2018 |
| WO | 2019/043434 A1 | 3/2019 |

OTHER PUBLICATIONS

Office action received for corresponding Finnish Patent Application No. 20205889, dated Apr. 15, 2021, 9 pages.

Extended European Search Report received for corresponding European Patent Application No. 21194799.9, dated Feb. 3, 2022, 13 pages.

Abdelaziz et al., "Decorrelation-Based Concurrent Digital Predistortion With a Single Feedback Path", IEEE Transactions on Microwave Theory and Techniques, vol. 66, No. 1, Jan. 2018, pp. 280-293.

\* cited by examiner

INTERFERENCE MITIGATION WITH MULTI-BAND DIGITAL PRE-DISTORTION

FIELD

The following exemplary embodiments relate to wireless communication and operating over multiple frequency bands.

BACKGROUND

An access node may enable wireless network connections to terminal devices. A part of the access node is a power amplifier which may introduce nonlinearity which may lead to undesired broadening of frequency spectrum being used. Therefore, it is desirable to be able to anticipate the kind of nonlinearity that may be introduced such that measures can be taken to mitigate or prevent the nonlinearity from occurring.

BRIEF DESCRIPTION

The scope of protection sought for various embodiments of the invention is set out by the independent claims. The exemplary embodiments and features, if any, described in this specification that do not fall under the scope of the independent claims are to be interpreted as examples useful for understanding various embodiments of the invention.

According to another aspect there is provided an apparatus comprising means for determining a plurality of digital pre-distortion engines, determining signals for the pre-distortion engines, determining terms for a matrix and filter the matrix, based on the filtered matrix, determining correlation matrixes, obtaining pre-distorted signals from the digital pre-distortion engines, wherein the pre-distorted signals are pre-distorted based on the determined correlation matrixes, and combining the pre-distorted signals to a combined pre-distorted signal.

According to another aspect there is provided an apparatus comprising at least one processor, and at least one memory including a computer program code, wherein the at least one memory and the computer program code are configured, with the at least one processor, to cause the apparatus to: determine a plurality of digital pre-distortion engines, determine signals for the pre-distortion engines, determine terms for a matrix and filter the matrix, based on the filtered matrix, determine correlation matrixes, obtain pre-distorted signals from the digital pre-distortion engines, wherein the pre-distorted signals are pre-distorted based on the determined correlation matrixes, and combine the pre-distorted signals to a combined pre-distorted signal.

According to another aspect there is provided a method comprising determining a plurality of digital pre-distortion engines, determining signals for the pre-distortion engines, determining terms for a matrix and filter the matrix, based on the filtered matrix, determining correlation matrixes, obtaining pre-distorted signals from the digital pre-distortion engines, wherein the pre-distorted signals are pre-distorted based on the determined correlation matrixes, and combining the pre-distorted signals to a combined pre-distorted signal.

According to another aspect there is provided a computer program product readable by a computer and, when executed by the computer, configured to cause the computer to execute a computer process comprising determining a plurality of digital pre-distortion engines, determining signals for the pre-distortion engines, determining terms for a matrix and filter the matrix, based on the filtered matrix, determining correlation matrixes, obtaining pre-distorted signals from the digital pre-distortion engines, wherein the pre-distorted signals are pre-distorted based on the determined correlation matrixes, and combining the pre-distorted signals to a combined pre-distorted signal.

According to another aspect there is provided a computer program product comprising computer-readable medium bearing computer program code embodied therein for use with a computer, the computer program code comprising code for performing determining a plurality of digital pre-distortion engines, determining signals for the pre-distortion engines, determining terms for a matrix and filter the matrix, based on the filtered matrix, determining correlation matrixes, obtaining pre-distorted signals from the digital pre-distortion engines, wherein the pre-distorted signals are pre-distorted based on the determined correlation matrixes, and combining the pre-distorted signals to a combined pre-distorted signal.

According to another aspect there is provided a computer program product comprising instructions for causing an apparatus to perform at least the following: determine a plurality of digital pre-distortion engines, determine signals for the pre-distortion engines, determine terms for a matrix and filter the matrix, based on the filtered matrix, determine correlation matrixes, obtain pre-distorted signals from the digital pre-distortion engines, wherein the pre-distorted signals are pre-distorted based on the determined correlation matrixes, and combine the pre-distorted signals to a combined pre-distorted signal.

According to another aspect there is provided a computer program comprising instructions for causing an apparatus to perform at least the following: determine a plurality of digital pre-distortion engines, determine signals for the pre-distortion engines, determine terms for a matrix and filter the matrix, based on the filtered matrix, determine correlation matrixes, obtain pre-distorted signals from the digital pre-distortion engines, wherein the pre-distorted signals are pre-distorted based on the determined correlation matrixes, and combine the pre-distorted signals to a combined pre-distorted signal.

According to another aspect there is provided a computer readable medium comprising program instructions for causing an apparatus to perform at least the following: determine a plurality of digital pre-distortion engines, determine signals for the pre-distortion engines, determine terms for a matrix and filter the matrix, based on the filtered matrix, determine correlation matrixes, obtain pre-distorted signals from the digital pre-distortion engines, wherein the pre-distorted signals are pre-distorted based on the determined correlation matrixes, and combine the pre-distorted signals to a combined pre-distorted signal.

According to another aspect there is provided a non-transitory computer readable medium comprising program instructions for causing an apparatus to perform at least the following: determine a plurality of digital pre-distortion engines, determine signals for the pre-distortion engines, determine terms for a matrix and filter the matrix, based on the filtered matrix, determine correlation matrixes, obtain pre-distorted signals from the digital pre-distortion engines, wherein the pre-distorted signals are pre-distorted based on the determined correlation matrixes, and combine the pre-distorted signals to a combined pre-distorted signal.

According to another aspect there is provided a system comprising a transmitter, a power amplifier and an apparatus that comprises at least one processor, and at least one memory including a computer program code, wherein the system is caused to: determine a plurality of digital pre-distortion engines, determine signals for the pre-distortion engines, determine terms for a matrix and filter the matrix, based on the filtered matrix, determine correlation matrixes, obtain pre-distorted signals from the digital pre-distortion engines, wherein the pre-distorted signals are pre-distorted based on the determined correlation matrixes, and combine the pre-distorted signals to a combined pre-distorted signal.

According to another aspect there is provided a system comprising means for: determining a plurality of digital pre-distortion engines, determining signals for the pre-distortion engines, determining terms for a matrix and filter the matrix, based on the filtered matrix, determining correlation matrixes, obtaining pre-distorted signals from the digital pre-distortion engines, wherein the pre-distorted signals are pre-distorted based on the determined correlation matrixes, and combining the pre-distorted signals to a combined pre-distorted signal.

LIST OF DRAWINGS

In the following, the invention will be described in greater detail with reference to the embodiments and the accompanying drawings, in which FIG. 1 illustrates an exemplary embodiment of a radio access network.

Figure 4:
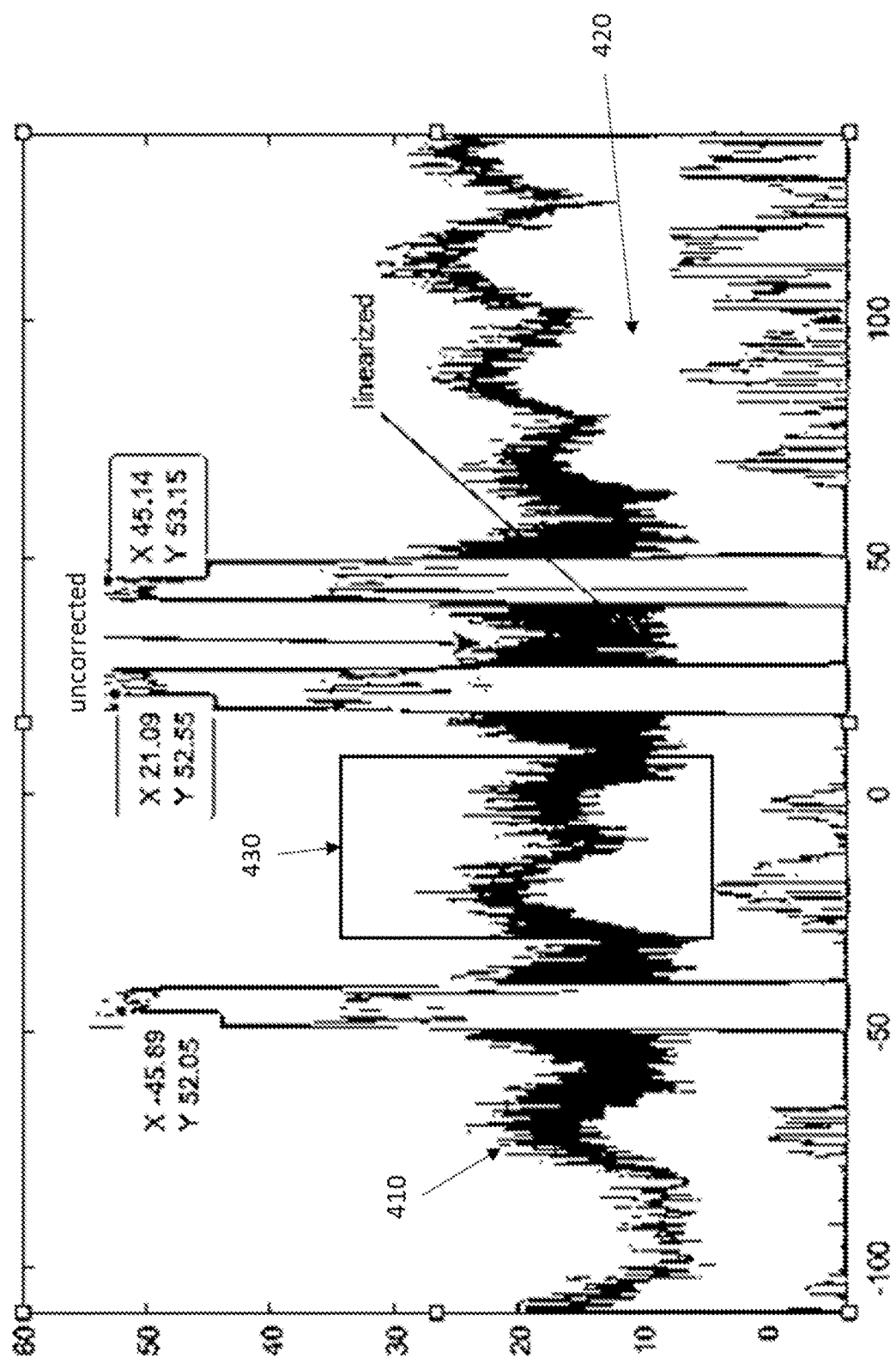
Figure 5:
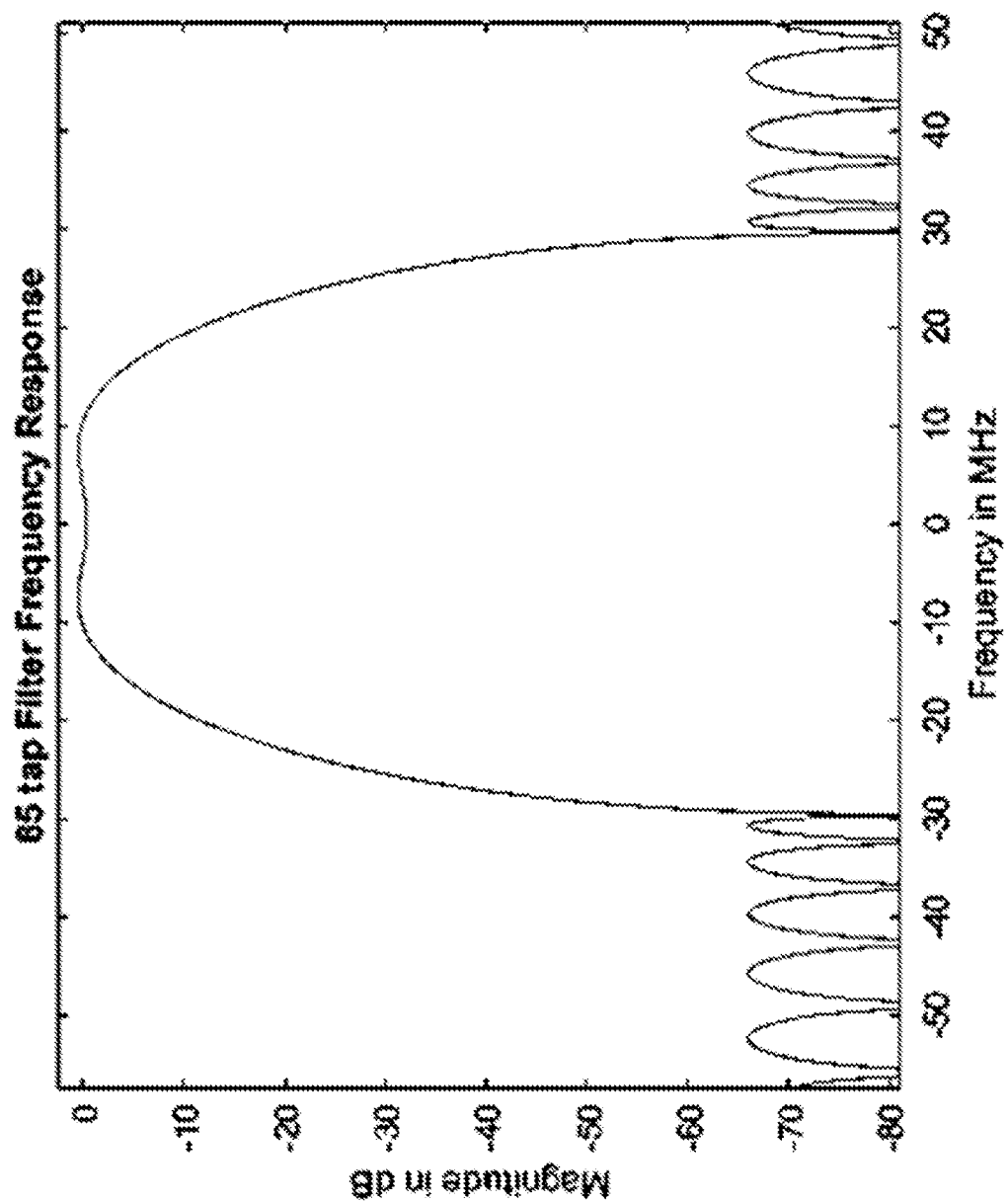
Figure 6:
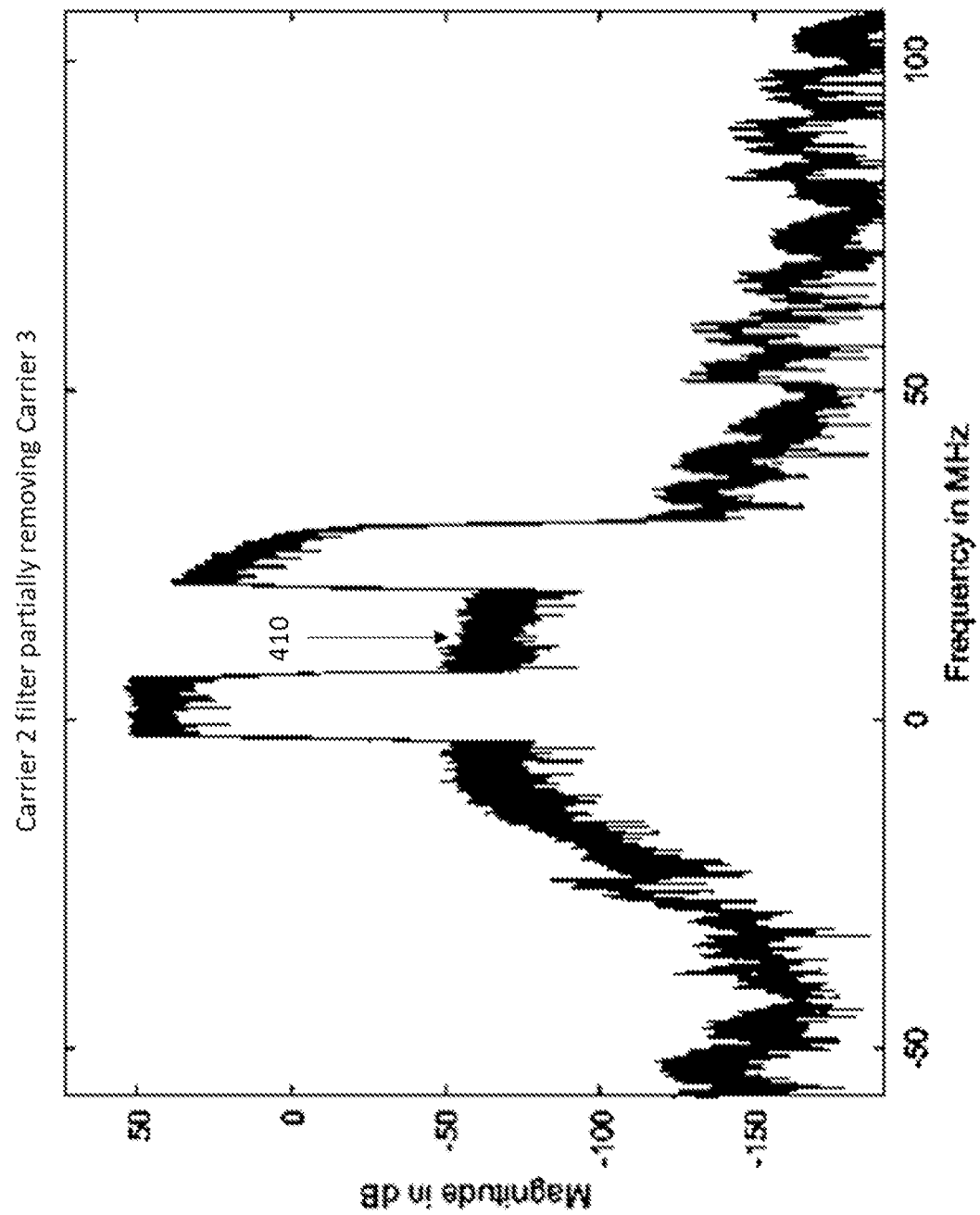

FIG. 4, FIG. 5, and FIG. 6 illustrates simulation results according to an exemplary embodiment.

Figure 7:
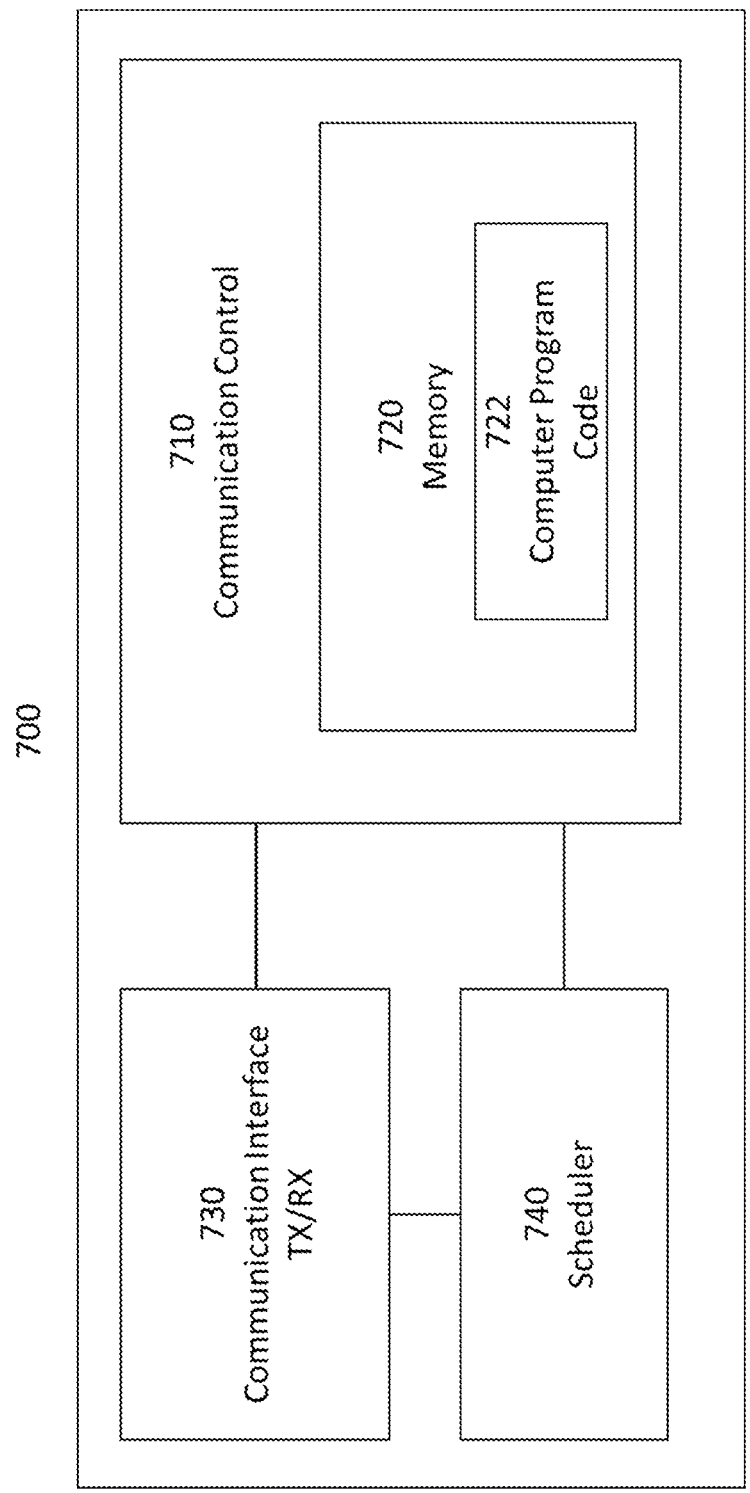

FIG. 7 illustrates an exemplary embodiment of an apparatus.

DESCRIPTION OF EMBODIMENTS

The following embodiments are exemplifying. Although the specification may refer to "an", "one", or "some" embodiment(s) in several locations of the text, this does not necessarily mean that each reference is made to the same embodiment(s), or that a particular feature only applies to a single embodiment. Single features of different embodiments may also be combined to provide other embodiments.

As used in this application, the term 'circuitry' refers to all of the following: (a) hardware-only circuit implementations, such as implementations in only analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present. This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device. The above-described embodiments of the circuitry may also be considered as embodiments that provide means for carrying out the embodiments of the methods or processes described in this document.

The techniques and methods described herein may be implemented by various means. For example, these techniques may be implemented in hardware (one or more devices), firmware (one or more devices), software (one or more modules), or combinations thereof. For a hardware implementation, the apparatus(es) of embodiments may be implemented within one or more application-specific integrated circuits (ASICs), digital signal processors (DSPs), digital signal processing devices (DSPDs), programmable logic devices (PLDs), field programmable gate arrays (FPGAs), graphics processing units (GPUs), processors, controllers, micro-controllers, microprocessors, other electronic units designed to perform the functions described herein, or a combination thereof. For firmware or software, the implementation may be carried out through modules of at least one chipset (e.g. procedures, functions, and so on) that perform the functions described herein. The software codes may be stored in a memory unit and executed by processors. The memory unit may be implemented within the processor or externally to the processor. In the latter case, it can be communicatively coupled to the processor via any suitable means. Additionally, the components of the systems described herein may be rearranged and/or complemented by additional components in order to facilitate the achievements of the various aspects, etc., described with regard thereto, and they are not limited to the precise configurations set forth in the given figures, as will be appreciated by one skilled in the art.

Embodiments described herein may be implemented in a communication system, such as in at least one of the following: Global System for Mobile Communications (GSM) or any other second generation cellular communication system, Universal Mobile Telecommunication System (UMTS, 3G) based on basic wideband-code division multiple access (W-CDMA), high-speed packet access (HSPA), Long Term Evolution (LTE), LTE-Advanced, a system based on IEEE 802.11 specifications, a system based on IEEE 802.15 specifications, and/or a fifth generation (5G) mobile or cellular communication system. The embodiments are not, however, restricted to the system given as an example but a person skilled in the art may apply the solution to other communication systems provided with necessary properties.

Figure 1:
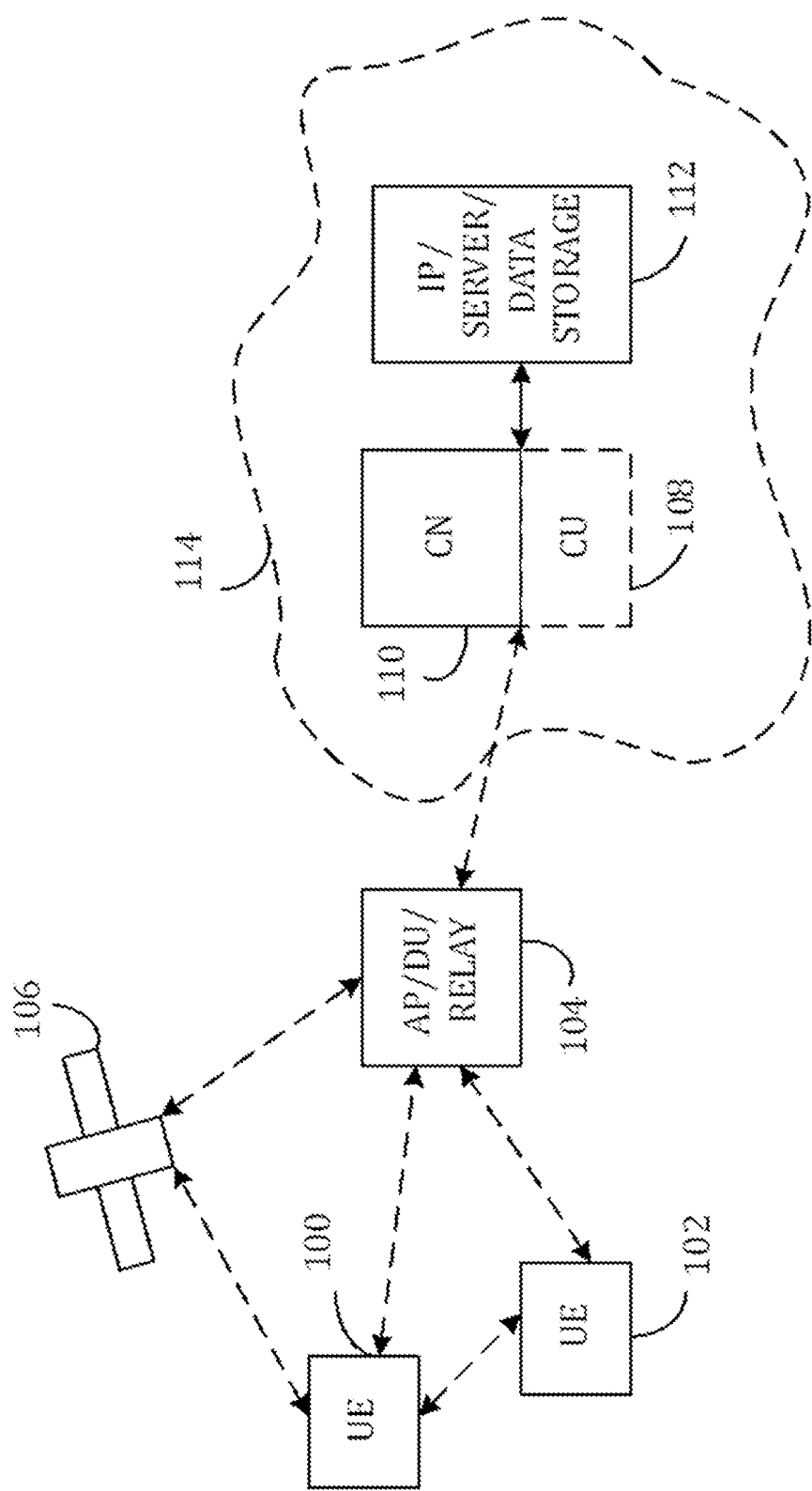

FIG. 1 depicts examples of simplified system architectures showing some elements and functional entities, all being logical units, whose implementation may differ from what is shown. The connections shown in FIG. 1 are logical connections; the actual physical connections may be different. It is apparent to a person skilled in the art that the system may comprise also other functions and structures than those shown in FIG. 1. The example of FIG. 1 shows a part of an exemplifying radio access network.

FIG. 1 shows terminal devices 100 and 102 configured to be in a wireless connection on one or more communication channels in a cell with an access node (such as (e/g)NodeB) 104 providing the cell. The access node 104 may also be referred to as a node. The physical link from a terminal device to a (e/g)NodeB is called uplink or reverse link and the physical link from the (e/g)NodeB to the terminal device is called downlink or forward link. It should be appreciated that (e/g)NodeBs or their functionalities may be implemented by using any node, host, server or access point etc. entity suitable for such a usage. It is to be noted that although one cell is discussed in this exemplary embodiment, for the sake of simplicity of explanation, multiple cells may be provided by one access node in some exemplary embodiments.

A communication system may comprise more than one (e/g)NodeB in which case the (e/g)NodeBs may also be configured to communicate with one another over links, wired or wireless, designed for the purpose. These links may be used for signalling purposes. The (e/g)NodeB is a computing device configured to control the radio resources of communication system it is coupled to. The (e/g)NodeB may also be referred to as a base station, an access point or any other type of interfacing device including a relay station capable of operating in a wireless environment. The (e/g)NodeB includes or is coupled to transceivers. From the transceivers of the (e/g)NodeB, a connection is provided to an antenna unit that establishes bi-directional radio links to user devices. The antenna unit may comprise a plurality of antennas or antenna elements. The (e/g)NodeB is further connected to core network 110 (CN or next generation core NGC). Depending on the system, the counterpart on the CN side may be a serving gateway (S-GW, routing and forwarding user data packets), packet data network gateway (P-GW), for providing connectivity of terminal devices (UEs) to external packet data networks, or mobile management entity (MME), etc.

The terminal device (which may also be called as UE, user equipment, user terminal, user device, etc.) illustrates one type of an apparatus to which resources on the air interface are allocated and assigned, and thus any feature described herein with a terminal device may be implemented with a corresponding apparatus, such as a relay node. An example of such a relay node is a layer 3 relay (self-backhauling relay) towards the base station. Another example of such a relay node is a layer 2 relay. Such a relay node may contain a terminal device part and a Distributed Unit (DU) part. A CU (centralized unit) may coordinate the DU operation via F1AP-interface for example.

The terminal device may refer to a portable computing device that includes wireless mobile communication devices operating with or without a subscriber identification module (SIM), or an embedded SIM, eSIM, including, but not limited to, the following types of devices: a mobile station (mobile phone), smartphone, personal digital assistant (PDA), handset, device using a wireless modem (alarm or measurement device, etc.), laptop and/or touch screen computer, tablet, game console, notebook, and multimedia device. It should be appreciated that a terminal device may also be an exclusive or a nearly exclusive uplink only device, of which an example is a camera or video camera loading images or video clips to a network. A terminal device may also be a device having capability to operate in Internet of Things (IoT) network which is a scenario in which objects are provided with the ability to transfer data over a network without requiring human-to-human or human-to-computer interaction. The terminal device may also utilise cloud. In some applications, a terminal device may comprise a small portable device with radio parts (such as a watch, earphones or eyeglasses) and the computation is carried out in the cloud. The terminal device (or in some embodiments a layer 3 relay node) is configured to perform one or more of user equipment functionalities.

Various techniques described herein may also be applied to a cyber-physical system (CPS) (a system of collaborating computational elements controlling physical entities). CPS may enable the implementation and exploitation of massive amounts of interconnected ICT devices (sensors, actuators, processors microcontrollers, etc.) embedded in physical objects at different locations. Mobile cyber physical systems, in which the physical system in question has inherent mobility, are a subcategory of cyber-physical systems. Examples of mobile physical systems include mobile robotics and electronics transported by humans or animals.

Additionally, although the apparatuses have been depicted as single entities, different units, processors and/or memory units (not all shown in FIG. 1) may be implemented.

5G enables using multiple input-multiple output (MIMO) antennas, many more base stations or nodes than the LTE (a so-called small cell concept), including macro sites operating in co-operation with smaller stations and employing a variety of radio technologies depending on service needs, use cases and/or spectrum available. 5G mobile communications supports a wide range of use cases and related applications including video streaming, augmented reality, different ways of data sharing and various forms of machine type applications such as (massive) machine-type communications (mMTC), including vehicular safety, different sensors and real-time control. 5G is expected to have multiple radio interfaces, namely below 6 GHz, cmWave and mmWave, and also being integratable with existing legacy radio access technologies, such as the LTE. Integration with the LTE may be implemented, at least in the early phase, as a system, where macro coverage is provided by the LTE and 5G radio interface access comes from small cells by aggregation to the LTE. In other words, 5G is planned to support both inter-RAT operability (such as LTE-5G) and inter-RI operability (inter-radio interface operability, such as below 6 GHz-cmWave, below 6 GHz-cmWave-mmWave). One of the concepts considered to be used in 5G networks is network slicing in which multiple independent and dedicated virtual sub-networks (network instances) may be created within the same infrastructure to run services that have different requirements on latency, reliability, throughput and mobility.

The current architecture in LTE networks is fully distributed in the radio and fully centralized in the core network. The low latency applications and services in 5G may require to bring the content close to the radio which may lead to local break out and multi-access edge computing (MEC). 5G enables analytics and knowledge generation to occur at the source of the data. This approach requires leveraging resources that may not be continuously connected to a network such as laptops, smartphones, tablets and sensors. MEC provides a distributed computing environment for application and service hosting. It also has the ability to store and process content in close proximity to cellular subscribers for faster response time. Edge computing covers a wide range of technologies such as wireless sensor networks, mobile data acquisition, mobile signature analysis, cooperative distributed peer-to-peer ad hoc networking and processing also classifiable as local cloud/fog computing and grid/mesh computing, dew computing, mobile edge computing, cloudlet, distributed data storage and retrieval, autonomic self-healing networks, remote cloud services, augmented and virtual reality, data caching, Internet of Things (massive connectivity and/or latency critical), critical communications (autonomous vehicles, traffic safety, real-time analytics, time-critical control, healthcare applications).

The communication system is also able to communicate with other networks, such as a public switched telephone network or the Internet 112, and/or utilise services provided by them. The communication network may also be able to support the usage of cloud services, for example at least part of core network operations may be carried out as a cloud service (this is depicted in FIG. 1 by "cloud" 114). The communication system may also comprise a central control entity, or a like, providing facilities for networks of different operators to cooperate for example in spectrum sharing.

Edge cloud may be brought into radio access network (RAN) by utilizing network function virtualization (NFV) and software defined networking (SDN). Using edge cloud may mean access node operations to be carried out, at least partly, in a server, host or node operationally coupled to a remote radio head or base station comprising radio parts. It is also possible that node operations will be distributed among a plurality of servers, nodes or hosts. Application of cloudRAN architecture enables RAN real time functions being carried out at the RAN side (in a distributed unit, DU 104) and non-real time functions being carried out in a centralized manner (in a centralized unit, CU 108).

It should also be understood that the distribution of labour between core network operations and base station operations may differ from that of the LTE or even be non-existent. Some other technology that may be used includes for example Big Data and all-IP, which may change the way networks are being constructed and managed. 5G (or new radio, NR) networks are being designed to support multiple hierarchies, where MEC servers may be placed between the core and the base station or nodeB (gNB). It should be appreciated that MEC can be applied in 4G networks as well.

5G may also utilize satellite communication to enhance or complement the coverage of 5G service, for example by providing backhauling. Possible use cases comprise providing service continuity for machine-to-machine (M2M) or Internet of Things (IoT) devices or for passengers on board of vehicles, and/or ensuring service availability for critical communications, and/or future railway/maritime/aeronautical communications. Satellite communication may utilise geostationary earth orbit (GEO) satellite systems, but also low earth orbit (LEO) satellite systems, for example, mega-constellations (systems in which hundreds of (nano)satellites are deployed). Each satellite 106 in the mega-constellation may cover several satellite-enabled network entities that create on-ground cells. The on-ground cells may be created through an on-ground relay node 104 or by a gNB located on-ground or in a satellite or part of the gNB may be on a satellite, the DU for example, and part of the gNB may be on the ground, the CU for example. Additionally, or alternatively, high-altitude platform station, HAPS, systems may be utilized. HAPS may be understood as radio stations located on an object at an altitude of 20-50 kilometres and at a fixed point relative to the Earth. For example, broadband access may be delivered via HAPS using lightweight, solar-powered aircraft and airships at an altitude of 20-25 kilometres operating continually for several months for example.

It is to be noted that the depicted system is an example of a part of a radio access system and the system may comprise a plurality of (e/g)NodeBs, the terminal device may have an access to a plurality of radio cells and the system may comprise also other apparatuses, such as physical layer relay nodes or other network elements, etc. At least one of the (e/g)NodeBs may be a Home(e/g)nodeB. Additionally, in a geographical area of a radio communication system a plurality of different kinds of radio cells as well as a plurality of radio cells may be provided. Radio cells may be macro cells (or umbrella cells) which are large cells, usually having a diameter of up to tens of kilometers, or smaller cells such as micro-, femto- or picocells. The (e/g)NodeBs of FIG. 1 may provide any kind of these cells. A cellular radio system may be implemented as a multilayer network including several kinds of cells. In some exemplary embodiments, in multilayer networks, one access node provides one kind of a cell or cells, and thus a plurality of (e/g)NodeBs are required to provide such a network structure.

For fulfilling the need for improving the deployment and performance of communication systems, the concept of "plug-and-play" (e/g)NodeBs has been introduced. A network which is able to use "plug-and-play" (e/g)NodeBs, may include, in addition to Home (e/g)NodeBs (H(e/g) nodeBs), a home node B gateway, or HNB-GW (not shown in FIG. 1). A HNB Gateway (HNB-GW), which may be installed within an operator's network may aggregate traffic from a large number of HNBs back to a core network.

In a wireless network operating on multiple frequency bands is beneficial as it enables flexibility that is not achieved when operating on single frequency band. However, if the frequency bands are close to each other, the likelihood of intermodulation interference is increased. Intermodulation may be understood as amplitude modulation of signals containing two or more different frequencies, frequency components, and it may be caused by nonlinearities in a system. In an access node, a source for non-linearity may be a power amplifier, PA, due to limitations of its electronic components or may also be caused by algorithms used. The intermodulation between frequencies components may form additional components at frequencies that are not just at integer multiples of either frequency components, but also at a sum and difference frequencies of the original frequencies and at sums and differences of multiples of those frequencies. If intermodulation interference occurs, it is possible that it cannot be filtered out. This may be due to a finite roll-off response of filters used. For example, in digital filtering, hardware or software implementations may comprise a limited number of multipliers, thereby forcing to use a finite number of taps per filter. For example, some designs allocate either 32, 64, 96 filter taps per digital filter. Due to the limited amount of filter taps, a filter roll-off may occur slowly in a frequency thereby causing signal interference in bands that are adjacent.

In order to mitigate the nonlinearity caused by a PA, a digital pre-distortion, DPD, may be utilized. DPD may enable a PA to function at, or close to, its saturation point. The DPD may utilize algorithms such as direct learning algorithm, DLA, indirect learning algorithm, ILA, or fixed point-based algorithms. In ILA, for example, an output signal is used as an input of a post-distorter to extract the parameters of a pre-distorter. The DLA, on the other hand, may be based on identifying a PA model, whose inverse PA model is a DPD function to be calculated, i.e. determined. The DLA may model the PA as a memory polynomial with odd terms, for example only odd terms, and may then calculate a reverse function of the memory polynomial by means of a recursive algorithm.

Figure 2:
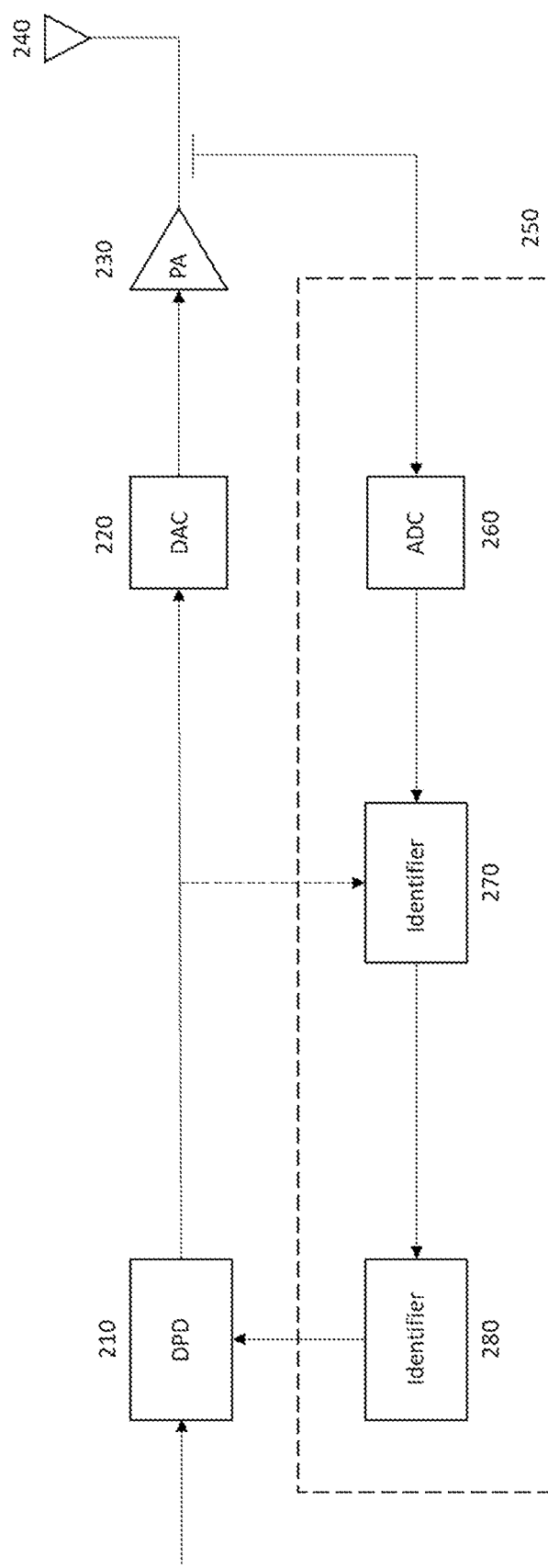
FIG. 2 illustrates an exemplary embodiment of mitigating nonlinearity.

FIG. 2 illustrates an exemplary embodiment of how DPD with direct learning could be used with a power amplifier to mitigate nonlinearity. A signal is first input to a digital pre-distorter 210 that then performs a DPD function and the pre-distorted signal is then converted by a digital to analog converter, DAC, 220 to an analog signal that is then amplified by the power amplifier 230. The amplified analog signal is transmitted by the transmitter 240. Also, the output amplified analog signal is used as an input to a feedback loop 250. In the feedback loop 250 the amplified analog signal is input to an analog to digital converter 260 to obtain a digital signal. The obtained digital signal is then input to an identifying unit 270 which filters and normalizes the signal. The identifying unit may also receive the pre-distorted signal output by the digital pre-distorter 210 as an input. The identifying unit 270 may then, based on the input signals, determine, by for example extracting, characteristics of the PA 230. These characteristics may then be used by the function unit 280 to determine a DPD function that may be used as an output from the feedback loop 250 that is then provided as an input to the digital pre-distorter 210. It is to be noted that the digital pre-distorter 210 also receives as an input a signal that has not bee pre-distorted and thus uses the feedback pre-distorted signal and a signal that has not been pre-distorted to produce a new pre-distorted signal.

An example of modelling a nonlinear component such as a PA 230 is a generalized memory polynomial, GMP, model. Other models that may be used to model a nonlinear electronic component are for example radial pruning Volterra model and simplified radial pruning Volterra model. In GMP model linear and multiple non-linear parts may be expressed in terms of the input signal x(n). Input signal may be shifted by q (i.e. x(n−q)) to represent memory of the nonlinear devices. Thus, a non-linear output of a component y(n) may be expressed with linear and nonlinear terms. These terms may also be understood as characteristics of the component.

A DPD engine may be understood as component, that may be a logical component that performs pre-distortion of an input signal in order to mitigate nonlinearities introduced by a PA when amplifying the signal. Thus, the DPD engine may dynamically, thanks to a feedback loop, produce inverse of PA characteristics. The DPD engine is implemented, in some exemplary embodiments, as a composite of one linear filter and N−1 high order term linear filters, though this implementation may vary. In this exemplary embodiment, the input to the linear filter may be the input signal. Each high order term filter may have as an input some power of the amplitude of the input and each may have a different number of taps as well. The filtering may be used to pre-distort the input signal and mitigate the PA distortion such that the baseband equivalent of the output of the PA is close to being the same as the input signal.

When multiple bands are used, there may be a DPD engine for each carrier or for each band or there may be a combination of engines dedicated to a band and engine dedicated to a carrier. Thus, for example, if there are 3 frequency bands used, then there may be three DPD engines correspondingly, one for each band. Yet, if the frequency bands, that are radio frequency, RF, bands, are close to each other causing intermodulation, IM, interference amongst each other, it may be that multiple DPD engines are not able to mitigate that interference. Thus, it would be desirable to further enhance DPD implementation such that the self-interference may be mitigated thereby allowing multiband operations even if the bands are close to each other.

Figure 3:
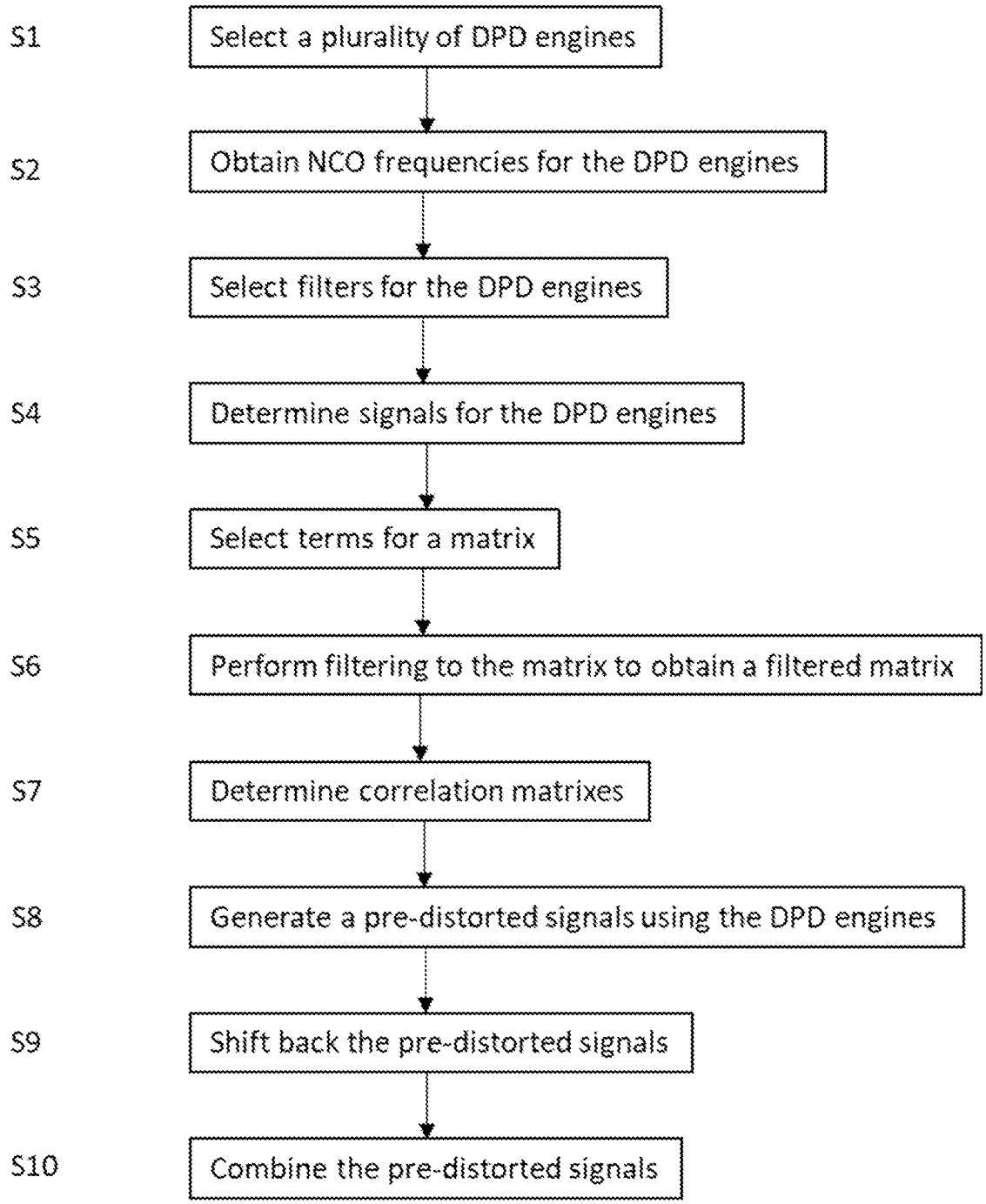
FIG. 3 illustrates a flow chart according to an exemplary embodiment.

FIG. 3 illustrates a flow chart according to an exemplary embodiment in which multiple DPD engines may be used even though there are multiple bands that are close to each other. In other words, self-interference mitigation for multiband DPD, SIM MDPD, is illustrated in this exemplary embodiment. First in S1 it is determined how many DPD engines are required. It may be possible to allocate one DPD engine per carrier or on a DPD engine per band or a combination of both. Next, in S2, frequencies of numerical control oscillators, NCOs, are obtained such that there are NCOs corresponding to the DPD engines. For example, one NCO for each DPD engine. The NCO frequency may be for example the centre of a collection of carriers. An NCO may be understood as a digital signal generator that creates a synchronous, discrete-time, discrete-valued representation of a waveform. NCOs may be used in conjunction with a DAC. Some benefits of an NCO may comprise agility, accuracy, stability and reliability.

Next, in S3, filters are selected for the DPD engines. There may be for example one filter for each DPD engine. In this exemplary embodiment the filters are finite impulse response, FIR, filters although in some other exemplary embodiments other filters may be used. FIR is a filter that has an impulse response of finite duration. In some other exemplary embodiments, one FIR filter may be used for multiple, even for all, DPD engines. If a real FIR filter, a FIR filter with no complex coefficients, is used, then the center of the DPD engine may be set to 0 Hz. If a complex FIR filter, a FIR filter with complex coefficients, is used, then the FIR filter may be specifically designed for its corresponding DPD engine. The center of the complex filter may be coincident with the corresponding DPD engine. In S4 signals are then determined for the DPD engines. For example, shifted terms for 0 Hz may be determined for a real FIR filter and represented as txb1, x1b, x2b and x3b. Alternatively, if a complex FIR filter is used, then the signals do not need to be shifted and the terms may be represented as tx, x1, x2, x3. In S5 then terms are selected for a matrix and thereby also a memory depth and a nonlinear order are selected.

In S6 a basis function filtering is performed to the matrix to generate a filtered matrix. The basis function filtering may be understood as filtering non-linear terms in time domain. It is to be noted that the configuration selected may be used irrespective of whether the terms are shifted to 0 Hz or center, or not. It is also to be noted that signals are not shifted if a complex FIR is used. In S7 then filtered correlation matrixes are determined. In this exemplary embodiment, the filtered matrixes are auto and cross correlation matrixes. Based on the matrixes, coefficients may be obtained in accordance with a DPD algorithm used. Then in S8 pre-distorted digital signals are generated by the DPD engines. Each DPD engine may generate a pre-distorted digital signal. If a real FIR filter is used, then the pre-distorted signals are centred at 0 Hz if the signals are shifted to 0 Hz. In S9 then the pre-distorted signals are shifted back to carrier or band center. Alternatively, if a complex FIR filter is used, the shifting back is not required as signals were not shifted to 0 Hz before. Then in S10 the pre-distorted signals from the DPD engines are combined to be a total pre-distorted signal. This may be described for example as: total pre-distorted signal=Pre-distorted signal 1+Pre-distorted signal 2+Pre-distorted signal 3. The total pre-distorted signal may then be used as part of the feedback loops of the engines thereby allowing determination regarding which DPD interferes with which one.

FIG. 4 illustrates simulation results of an exemplary embodiment such as the one illustrated in FIG. 3. In the simulated exemplary embodiment, there are three carries that are placed at frequencies, that may be considered as baseband frequencies. The frequencies are −45 MHz for carrier 1, +21 MHz for carrier 2 and +45 MHz for carrier 3 and therefore three DPD engines are used. In an alternative exemplary embodiment, carrier 1 may belong to RF band 1 and carriers 2 and 3 may belong to RF band 2 in which case two DPD engines would be used. The black part 410 illustrates IM interference between carriers 2 and 3 and the white part 420 below that illustrates the effect the linearization has in the exemplary embodiment. In this exemplary embodiment an area that will be suppressed by for example cavity filters is illustrated by the square 430.

The sample rate of the DPD engines in this exemplary embodiment is 491.52 MSPS. Higher sampling rates may also be used if the specific multi-band configuring is wider to meet Nyquist criterion. The signals in this this exemplary embodiment may be represented as tx=x1+x2+x3, in which tx is the un-predistorted signal composite in which all the three signals of FIG. 1 are included. x1 is the first carrier located at −45 MHz, which is band1, x2 is the second carrier located at 15 MHz, which is band 2 and x3 is the third carrier located at +45 MHz, which is band 3. Correspondingly, x1b is the first carrier shifted to 0 Hz. Associated NCO1 shift is +45 MHz, x2b is the $2^{nd}$ carrier shifted to 0 Hz. Associated NCO2 shift is −15 MHz, and x3b is the $3^{rd}$ carrier shifted to 0 Hz. Associated NCO3 shift is −45 MHz.

Fb1 is the feedback of the first carrier shifted to 0 Hz. Associated NCO1 shift of +45 MHz is used along with filtering to extract it. txb1 is the composite tx shifted with NCO1 as in x1b, which is +45 MHz. It is to be noted that the components x1b, txb1 and Fb1, associated with the first DPD engine are shifted to 0 Hz with NCO1.

Equations associated with the first DPD engine are discussed below. It is to be noted that the equations associated with the second DPD and the third DPD may be the same or similar. The results illustrated in FIG. 4 were obtained from the 3 DPD engines used in the exemplary embodiment. Thus, the matrix YMat was obtained:

$$YMat=\\[x1bx1b^*|x1b|^2x1b^*|x2b|^2x1b^*|x3b|^2txb1^*|txb1|^2x1b^*|x1b|^4x1b^*|x2b|^4x1b^*|x3b|^4txb1^*|txb1|^4]$$

The vertical columns of the matrix YMat are time-based shifts such as n, n+1, n+2 etc. Thus, YMat is an n×9 matrix. Yet, it is to be noted that the terms illustrated above may not be not fixed but the selection of the terms may be based on the complexity of the DPD model as well as the complexity of the PA and the carrier configuration. It is to be noted that memory terms are excluded from the discussion for simplicity. Examples of some additional terms that may be used in some exemplary embodiments are:

$$x1b^*(|x1b|^2+|x2b|^2+|x3b|^2)^k,$$

$$x1b^*(|x1b|^2+|x2b|^2)^k,$$

$$x1b^*(|x1b|^2+|x3b|^2)^k,$$

$$x1b^*(|x2b|^2+|x3b|^2)^k$$

$$x1b^*|x1b|^{2*k1}*|x2b|^{2*k2}*|x3b|^{2*k3}$$

$$x1b^*|x1b|^{2*k1}*|x2b|^{2*k2}$$

$$x1b^*|x1b|^{2*k1}*|x3b|^{2*k3}$$

$$x1b^*|x2b|^{2*k2}*|x3b|^{2*k3}$$

The matrix is derived without basis function filtering so the basis function filtering is applied next. The basis function filtering may be performed either in time domain or in frequency domain. An example of basis function filtering applied to a third order non-linearity is:

$$f(x1b^*|x1b|^2)$$

$$YMatf=[f(x1b)f(x1b^*|x1b|^2)f(x1b^*|x2b|^2)f(x1b^*|x3b|^2)f(txb1^*|txb1|^2)f(x1b^*|x1b|^4)f(x1b^*|x2b|^4)\ldots\\f(x1b^*|x3b|^4)f(txb1^*|txb1|^4)]$$

It is to be noted that the non-linear terms in YMatf are filtered, thus not exhibiting frequency components outside that of the filter f. This is beneficial for the SIM MDPD in which adjacent carrier IMs may be interfering with each other. Hence, the auto and cross correlation functions generated for DPD engines 2 and 3 may limit the frequency content to be within the filter response bandwidth. This allows the adjacent DPD engines to obtain an accurate estimate of the interfering IMs. Because of the basis function filtering, the least squares solution may obtain the frequency content that is applicable to a certain DPD engine. Although the adjacent DPD engines are overlapping in frequency domain identifying its own IMs may be achieved over a plurality of iterations.

If the auto- and the cross-correlation functions had not been filtered, the non-linear basis functions would exhibit unrestricted frequency components. Thus, an ineffective IM estimation would be resulted when such IMs are interfering between the adjacent DPD engines. Such a solution may not mitigate the self-interfering components correctly as the least squares solutions used by the DPD engines may not have the correct frequency exposure for the interfering IMs. Below are examples of the auto- and cross-correlation functions.

Basis function filtered auto correlation function: $Auto1=(YMatf^H)(YMatf)$

Basis function filtered cross correlation function: $Cross1=(YMatf^H)(f(Fb1))$

DLA coefficients: $wn1=Auto1^{-1}*(Cross1)$

Once the identification is complete, the pre-distortion wave form may be generated in baseband that is 0 Hz. Pre-distorted waveform, Pred1b(n), may then be shifted to the correct frequency with a conjugate of NCO1. The following equations illustrate how the pre-distortion waveform may be generated for the first DPD engine corresponding to carrier 1. Pre-distorted waveforms for other carriers may be generated in a similar way.

$$Pred1b(n)=x1b(n)+filter(TotalError(n))$$

$$TotalError(n)=ymat_n*wn1$$

$ymat_n$ is the row vector of the matrix YMat corresponding to time n. TotalError is filtered before it is added to the desired signal x1b. It to be noted that the Pred1b is in this example at the baseband 0 Hz. Pred1b(n) will then be shifted back to its original frequency −45 MHz before being added to other pre-distorted signals.

FIG. 5 illustrates simulation results when a 65-tap digital filter is used in the exemplary embodiment of FIG. 4. Each carrier may be cantered to the middle of the filter. The filter may be a real FIR or a complex FIR filter for example. If a real FIR filter is used the carriers are shifted to 0 Hz. If a complex filter is used the shift may not be needed. IMs within this filter are corrected and the correction may be controlled by either widening or narrowing the filter without outnumbering the dedicated filter taps.

FIG. 6 illustrates simulation results when real FIR filter is applied to an undistorted, clean, signal in band 2. Since the filters are real and therefore symmetric around 0 Hz the carriers are shifted to place the centre of carrier 2, or band 2, to be near 0 Hz which is the centre of the filter. As illustrated, the filter is unable to fully suppress carrier 3. Hence any inter carrier IMs 410 illustrated in FIG. 4 do not experience any attenuation. This may be corrected by applying the exemplary embodiment illustrated in FIG. 3.

Advantages of the exemplary embodiments described above comprise the ability to linearize PA in a multi-carrier and a multi-band situation. The SIM MDPD described above may be used with any carrier separation. Hence, in some exemplary embodiments, a contiguous carrier such as NR-100 may be split into multiple bands using the SIM MDPD concept described above.

The apparatus 700 of FIG. 7 illustrates an example embodiment of an apparatus that may be an access node or be comprised in an access node. The apparatus may be, for example, a circuitry or a chipset applicable to an access node to realize the described embodiments. The apparatus 700 may be an electronic device comprising one or more electronic circuitries. The apparatus 700 may comprise a communication control circuitry 710 such as at least one processor, and at least one memory 720 including a computer program code (software) 722 wherein the at least one memory and the computer program code (software) 722 are configured, with the at least one processor, to cause the apparatus 700 to carry out any one of the example embodiments of the access node described above.

The memory 720 may be implemented using any suitable data storage technology, such as semiconductor-based memory devices, flash memory, magnetic memory devices and systems, optical memory devices and systems, fixed memory and removable memory. The memory may comprise a configuration database for storing configuration data. For example, the configuration database may store current neighbour cell list, and, in some example embodiments, structures of the frames used in the detected neighbour cells.

The apparatus 700 may further comprise a communication interface 730 comprising hardware and/or software for realizing communication connectivity according to one or more communication protocols.

The communication interface 730 may provide the apparatus with radio communication capabilities to communicate in the cellular communication system. The communication interface may, for example, provide a radio interface to terminal devices. The apparatus 700 may further comprise another interface towards a core network such as the network coordinator apparatus and/or to the access nodes of the cellular communication system. The apparatus 700 may further comprise a scheduler 740 that is configured to allocate resources.

The processor 710 interprets computer program instructions and processes data. The processor 710 may comprise one or more programmable processors. The processor 710 may comprise programmable hardware with embedded firmware and may, alternatively or additionally, comprise one or more application specific integrated circuits, ASICs.

The processor 710 is coupled to a memory 720. The processor is configured to read and write data to and from the memory 720. The memory 720 may comprise one or more memory units. The memory units may be volatile or non-volatile. It is to be noted that in some example embodiments there may be one or more units of non-volatile memory and one or more units of volatile memory or, alternatively, one or more units of non-volatile memory, or, alternatively, one or more units of volatile memory. Volatile memory may be for example RAM, DRAM or SDRAM. Non-volatile memory may be for example ROM, PROM, EEPROM, flash memory, optical storage or magnetic storage. In general, memories may be referred to as non-transitory computer readable media. The memory 720 stores computer readable instructions that are execute by the processor 710. For example, non-volatile memory stores the computer readable instructions and the processor 710 executes the instructions using volatile memory for temporary storage of data and/or instructions.

The computer readable instructions may have been pre-stored to the memory 720 or, alternatively or additionally, they may be received, by the apparatus, via electromagnetic carrier signal and/or may be copied from a physical entity such as computer program product. Execution of the computer readable instructions causes the apparatus 700 to perform functionality described above.

In the context of this document, a "memory" or "computer-readable media" may be any non-transitory media or means that can contain, store, communicate, propagate or transport the instructions for use by or in connection with an instruction execution system, apparatus, or device, such as a computer.

It is to be noted that the apparatus 700 may further comprise various component not illustrated in the FIG. 7. The various components may be hardware component and/or software components.

Even though the invention has been described above with reference to an example according to the accompanying drawings, it is clear that the invention is not restricted thereto but can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. An apparatus comprising at least one processor, and at least one memory including a computer program code, wherein the at least one memory and the computer program code are configured, with the at least one processor, to cause the apparatus to:

determine a plurality of digital pre-distortion engines;

determine signals for the plurality of the pre-distortion engines, the signals being received on a plurality of carrier frequencies or on a plurality frequency bands, and an amount of digital pre-distortion engines comprised in the digital pre-distortion engines is determined based on the plurality of carrier frequencies or based on the plurality frequency bands;

determine terms for a matrix and perform basis function filtering on the matrix, the terms being based on the signals and determined based on frequencies of the signals, and the matrix is built based on a combination of the terms;

based on the filtered matrix, determine correlation matrixes;

obtain pre-distorted signals from the digital pre-distortion engines, wherein the pre-distorted signals are pre-distorted based on the determined correlation matrixes; and combine the pre-distorted signals to a combined pre-distorted signal.

2. The apparatus according to claim 1, wherein the determined terms are memoryless terms.

3. The apparatus according to claim 1, wherein the combined pre-distorted signal is input to a power amplifier.

4. The apparatus according to claim 1, wherein at least one of the plurality of pre-distortion engines comprises a filter that is a real finite impulse response filter.

5. The apparatus according to claim 4, wherein the at least one pre-distortion engine is caused to perform a shift to a signal, that is comprised in the determined signals, to obtain a shifted signal.

6. The apparatus according to claim 5, wherein the at least one pre-distortion engine performs to the shifted signal a shift back to an original frequency before the shifted signal is combined to the combined pre-distorted signal.

7. The apparatus according to claim 1, wherein at least one of the plurality of pre-distortion engines comprises a filter for performing the basis function filtering on the matrix and the filter is a complex finite impulse response filter.

8. The apparatus according to claim 1, wherein the correlation matrixes comprise auto- and cross-correlation matrixes.

9. The apparatus according to claim 1, wherein the basis function filtering comprises filtering terms that are non-linear.

10. The apparatus according to claim 1, wherein the terms are determined based on at least one of the following: complexity of the digital pre-distortion engines, complexity of a power amplifier or complexity of a carrier configuration.

11. The apparatus according to claim 1, wherein the apparatus is configured to be used in an access node.

12. The apparatus according to claim 1, wherein the amount of pre-distortion engines comprised in the plurality of the digital pre-distortion engines is determined to be one digital pre-distortion engine per one carrier frequency or one digital pre-distortion engine per one frequency band.

13. A method comprising:
determining a plurality of digital pre-distortion engines;
determining signals for the plurality of the pre-distortion engines, the signals being received on a plurality of carrier frequencies or on a plurality frequency bands, and an amount of digital pre-distortion engines comprised in the digital pre-distortion engines is determined based on the plurality of carrier frequencies or based on the plurality frequency bands:
determining terms for a matrix and performing basis function filtering the matrix, the terms being based on the signals and determined based on frequencies of the signals, and the matrix is built based on a combination of the terms;
based on the filtered matrix, determining correlation matrixes;
obtaining pre-distorted signals from the digital pre-distortion engines, wherein the pre-distorted signals are pre-distorted based on the determined correlation matrixes; and
combining the pre-distorted signals to a combined pre-distorted signal.

14. The method according to claim 13, wherein the determined terms are memoryless terms.

15. The method according to claim 13, wherein the combined pre-distorted signal is input to a power amplifier.

16. The method according to claim 13, wherein at least one of the plurality of pre-distortion engines comprise a filter that is a real finite impulse response filter.

17. The method according to claim 13, wherein the amount of pre-distortion engines comprised in the plurality of the digital pre-distortion engines is determined to be one digital pre-distortion engine per one carrier frequency or one digital pre-distortion engine per one frequency band.

18. A non-transitory computer readable medium comprising program instructions for causing an apparatus to perform at least the following:
determine a plurality of digital pre-distortion engines;
determine signals for the plurality of the pre-distortion engines, the signals being received on a plurality of carrier frequencies or on a plurality frequency bands, and an amount of digital pre-distortion engines comprised in the digital pre-distortion engines is determined based on the plurality of carrier frequencies or based on the plurality frequency bands;
determine terms for a matrix and perform basis function filtering on the matrix, the terms being based on the signals and determined based on frequencies of the signals, and the matrix is built based on a combination of the terms;
based on the filtered matrix, determine correlation matrixes;
obtain pre-distorted signals from the digital pre-distortion engines, wherein the pre-distorted signals are pre-distorted based on the determined correlation matrixes; and
combine the pre-distorted signals to a combined pre-distorted signal.

19. A system comprising a transmitter, a power amplifier and an apparatus that comprises at least one processor, and at least one memory including a computer program code, wherein the system is caused to:
determine a plurality of digital pre-distortion engines;
determine signals for the plurality of the pre-distortion engines, the signals being received on a plurality of carrier frequencies or on a plurality frequency bands, and an amount of digital pre-distortion engines comprised in the digital pre-distortion engines is determined based on the plurality of carrier frequencies or based on the plurality frequency bands;
determine terms for a matrix and perform basis function filtering on the matrix, the terms being based on the signals and determined based on frequencies of the signals, and the matrix is built based on a combination of the terms;
based on the filtered matrix, determine correlation matrixes;
obtain pre-distorted signals from the digital pre-distortion engines, wherein the pre-distorted signals are pre-distorted based on the determined correlation matrixes; and
combine the pre-distorted signals to a combined pre-distorted signal.

\* \* \* \* \*